United States Patent

[11] 3,566,217

[72] Inventor Theodore W. Cooper
San Bruno, Calif.
[21] Appl. No. 764,121
[22] Filed Oct. 1, 1968
[45] Patented Feb. 23, 1971
[73] Assignee Globe-Union Inc.
Milwaukee, Wis.

[54] ELECTRICAL COMPONENT AND METHOD OF MANUFACTURE
4 Claims, 5 Drawing Figs.

[52] U.S. Cl. .......... 317/235, 317/234, 317/238
[51] Int. Cl. .......... H01l 11/14, H01l 19/00
[50] Field of Search .......... 317/234, 235, 237—241

[56] References Cited
UNITED STATES PATENTS

| | | | |
|---|---|---|---|
| 2,648,805 | 8/1953 | Spenke et al. | 317/235 |
| 2,759,854 | 8/1956 | Kilby | 317/101X |
| 2,791,760 | 5/1957 | Ross | 317/235X |
| 2,922,730 | 2/1960 | Feldman | 317/238 |
| 2,975,344 | 3/1961 | Wegener | 317/235 |
| 3,258,663 | 6/1966 | Weimer | 317/235 |
| 3,351,500 | 11/1967 | Khauri | 317/238X |

*Primary Examiner*—James D. Kallam
*Attorney*—Pendleton, Neuman, Williams & Anderson

ABSTRACT: An electrical component, which includes a film of semiconducting barium titanate with suitable ohmic or rectifying contacts, is described together with the method for its manufacture.

PATENTED FEB 23 1971 3,566,217

INVENTOR.
Theodore W. Cooper
BY Pendleton, Neuman
Seibold & Williams
Atty's

ELECTRICAL COMPONENT AND METHOD OF MANUFACTURE

BACKGROUND OF THE INVENTION

1. Field of the Invention

This invention relates to a novel electrical component and to a method for manufacturing the component.

2. Brief Description of the Prior Art

Most electrical circuits, for example those used in communications or entertainment applications, comprise an arrangement of discrete components electrically connected with wire, or through the use of printed circuit boards. These circuits are costly and relatively large because the components themselves have these properties and because assembly is expensive.

BRIEF DESCRIPTION OF THE PRESENT INVENTION

The present invention provides a relatively low-cost technique for producing electrical components and for integrating complete or partially complete electrical circuits. Briefly, the present invention employs a film of $BaTiO_3$ (barium titanate) applied to a suitable electrode on the surface of an insulating substrate by well-known means, such as by screen printing and sintering, or by evaporation or sputtering in vacuum. The $BaTiO_3$ film is made semiconducting (*n*-type) by causing a deficiency of oxygen in the mature film. Counterelectrodes may then be added along with sufficient oxygen at the $BaTiO_3$ surface to reestablish a stoichiometric interface between the metal counterelectrodes and the $BaTiO_3$ film. By so doing, the rectifying properties of this type of junction are established for use in the device being constructed Ohmic contacts are formed with a deficiency of oxygen at the interface.

This process is readily adaptable to the production of ceramic semiconductor integrated circuits and transistor devices. In particular, an integrated full wave rectifier and a field effect transistor are easily constructed, as described below.

As an example, palladium metal paint may be screened on a suitable ceramic substrate as an electrode, followed by screening on a film of a suitable $BaTiO_3$ paint. The substrate is then fired at sintering temperatures in an oxidizing atmosphere to first mature the $BaTiO_3$ film stoichiometrically, and then in a slightly lower temperature reducing atmosphere to cause a deficiency of oxygen, thus establishing its semiconducting properties. A suitable silver metal paint may then be screened on the reduced $BaTiO_3$ film at desired positions to cause rectifying contacts to be formed upon firing.

By suitably positioning various material films on insulating substrates, various circuit elements can be made and integrated with other circuit elements or circuits. For example, by proper positioning of material films and rectifying junctions, active elements may be realized, such as diodes, rectifiers, field effect transistors etc. The films useful for integrating such circuits and circuit elements include dielectric, conductive, semiconductive and resistive material films.

DETAILED DESCRIPTION OF PREFERRED EMBODIMENTS

Before describing the specific embodiments in detail, it may be helpful to describe the general conditions required to obtain semiconducting barium titanate and both ohmic and rectifying contacts on the barium titanate.

Semiconducting Films

The bulk film conditions which will assure semiconducting properties of the $BaTiO_3$ are reasonable uniformity of excess mobile electrons throughout the film as established by oxygen deficiency. Oxygen, as a gas ($O_2$), must have been liberated from the material of the film in order that the two excess orbital electrons, which are liberated upon the sharing of two electrons during formation of the $O_2$ molecule, remain mobile in the film lattice to act as the mobile carriers for *n*-type semiconduction. Thus, a reducible barium titanate formulation is necessary for this application.

Ohmic Contact

The interface conditions between the semiconducting $BaTiO_3$ film and the metal conductor of the intended ohmic connection must assure a deficiency of oxygen atoms (removed oxygen) at all points within, and at the transition surface of, the $BaTiO_3$ where it joins the metal.

Rectifying Contact

The interface conditions between the semiconducting $BaTiO_3$ film and the metal conductor of the intended rectifying connection must assure that at least an intrinsic conversion plane, if not a *conversion, be established during the transition from semiconducting $BaTiO_3$ to the metal conductor of the rectifying contact.*

Figure 1:
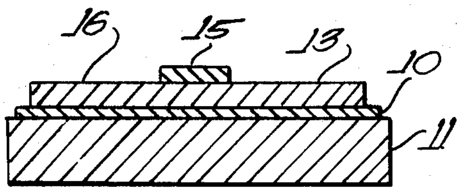
FIG. 1 is a cross-sectional view of a diode constructed according to the present invention.

The invention will be initially described with respect to the novel screened and fired diode construction shown in FIG. 1. The technique described, however, is well adapted to the formation of other components, as will appear more fully below.

The first step in the process of forming the diode shown in FIG. 1 is to form a metal electrode 10 on a substrate 11. A suitable ceramic substrate is one which will not react chemically with either the electrode material or the barium titanate film. Oxygen-stable barium titanate ($BaTiO_3$) is an example. Any suitable metal which will withstand the subsequent firing operations may be used for the electrode 10. Palladium and platinum are examples; however, other metals may also be used. The metal is, in this example, put onto the substrate by a conventional screening method where the metal is in a paint form.

After the electrode 10 has been formed on the substrate 11, a reducible barium titanate ($BaTiO_3$) film 13 is added over the electrode 10 to the desired thickness. The barium titanate film may be put on in a conventional manner, such as by screening and firing or by vacuum deposition. By way of example, the barium titanate may be prepared in reduced powder form with a binder added prior to the screening process. A suitable binder is 2 percent ester gum binder. After screening, the barium titanate film is matured and reduced. The barium titanate forms a thick film which will be between approximately 0.0002 and 0.020 inch and for most applications will exceed 0.003 inch. The substrate 11, electrode 10, and barium titanate film 13 are fired at a temperature of approximately 2500° F. in an oxidizing atmosphere, followed by a reducing atmosphere to remove oxygen, according to conventional processes.

After the maturing and reducing operations, an anode 15 is formed on the upper surface 16 of the barium titanate film 13. In the present embodiment, a rectifying contact is made between the anode 15 and the titanate film 13 by firing the device after the metal 15 is formed on top of the semiconducting film 13. While the particular metal 15 employed will depend to some extent upon the application, silver is an example of a suitable anode metal which may be screened in paint form onto the semiconducting barium titanate film 13.

Figure 2:
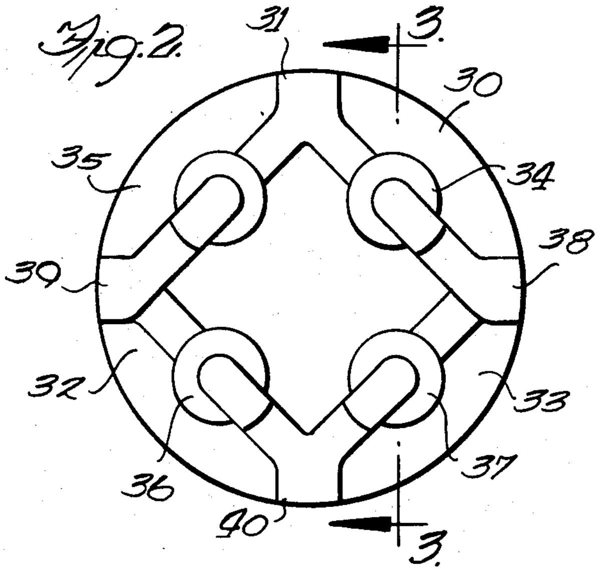
FIGS. 2 and 3 are the plan view and a cross-sectional view, respectively, of an integrated, full wave rectifier constructed according to the present invention.
Figure 3:
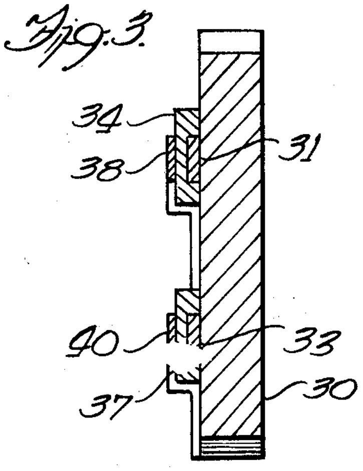

FIGS. 2 and 3 show an integrated full wave rectifier constructed according to the present invention. In making the rectifier, electrodes 31, 32 and 33 are screened onto a ceramic disc 30. Barium titanate films are then screened on to cover these electrodes 31, 32, 33 at four positions 34, 35, 36 and 37. After maturing and reducing the $BaTiO_3$ films, as described above, counterelectrodes 38, 39 and 40 are screened and fired to form rectifying junctions with the semiconducting $BaTiO_3$ films. Electrodes 33 and 38, as well as electrodes 32 and 39, are electrically common in this embodiment. A suitable alternating current supply connected across electrodes 38 and 39 will provide a direct current output between 31 and 40.

Figure 4:
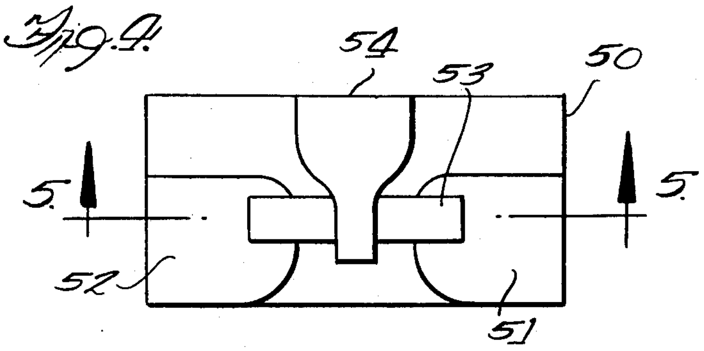
FIGS. 4 and 5 are the plan view and a cross-sectional view, respectively, of a field effect transistor constructed according to the present invention.
Figure 5:
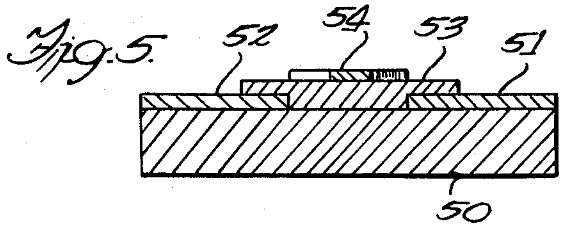

FIGS. 4 and 5 are plan and cross-sectional views, respectively, of a field effect transistor constructed according to the present invention. This device includes a substrate 50 with metal source and drain electrodes 51 and 52. A $BaTiO_3$ film 53 is applied between but overlapping electrodes 51 and 52 and the device is fired, maturing and reducing the $BaTiO_3$ film which now ohmically connects the electrodes. A rectifying counterelectrode 54 is provided by appropriate screening and firing operations and forms the gate electrode of the device.

While several specific embodiments have been described, it should be noted that the techniques of the present invention are well adapted to the integration or other manufacture of a wide variety of electrical components and circuits. It should be noted further that well-known techniques exist for device construction in addition to the examples given. It is intended that the examples cited do not limit the applicability of known construction techniques within the scope of this invention.

I claim:

1. An electrical component comprising an insulating substrate at least partially covered with metal, a film of semiconducting $BaTiO_3$ in the thickness range 0.0002 inch to 0.020 inch deposited on the metal and forming an ohmic contact therewith, and an electrode attached to the opposite side of said film with a rectifying junction in the region of said electrode.

2. The component of claim 1 wherein said metal is palladium and said electrode contains silver.

3. A full wave rectifier comprising an insulating base, four metal electrodes on said base, four discrete areas of semiconducting barium titanate on said electrodes forming ohmic contacts therewith, four electrodes on said four areas of barium titanate forming rectifying contacts therewith, two of said ohmic contact electrodes being electrically connected, two of said rectifying contact electrodes being electrically connected, the other two ohmic contact electrodes being electrically connected respectively to the other two of said rectifying contact electrodes.

4. A field effect transistor comprising an insulating base, source and drain metal electrodes on said base, a film of semiconducting barium titanate overlapping said electrodes and forming ohmic contacts therewith, a gate electrode positioned on said barium titanate and forming a rectifying contact therewith.